United States Patent
Jagoda

(10) Patent No.: US 11,272,630 B2
(45) Date of Patent: Mar. 8, 2022

(54) HYDRAULIC SYSTEM CONTROL MODULE HAVING IMPROVED HOUSING FEATURES AND METHOD OF MANUFACTURING THE SAME

(71) Applicant: DANFOSS POWER SOLUTIONS II TECHNOLOGY A/S, Nordborg (DK)

(72) Inventor: Aaron Hertzel Jagoda, Bloomington, MN (US)

(73) Assignee: DANFOSS POWER SOLUTIONS II TECHNOLOGY A/S, Nordborg (DK)

( * ) Notice: Subject to any disclaimer, the term of this patent is extended or adjusted under 35 U.S.C. 154(b) by 0 days.

(21) Appl. No.: 16/453,261

(22) Filed: Jun. 26, 2019

(65) Prior Publication Data
US 2020/0008312 A1 Jan. 2, 2020

Related U.S. Application Data

(60) Provisional application No. 62/692,072, filed on Jun. 29, 2018.

(51) Int. Cl.
*H05K 5/06* (2006.01)
*H01R 13/627* (2006.01)

(52) U.S. Cl.
CPC ......... *H05K 5/069* (2013.01); *H01R 13/6273* (2013.01)

(58) Field of Classification Search
CPC .... H05K 5/069; H05K 5/0073; H05K 5/0069; H05K 5/0034; H01R 13/6273
See application file for complete search history.

(56) References Cited

U.S. PATENT DOCUMENTS

| | | | |
|---|---|---|---|
| 5,236,098 A | 8/1993 | Sadigh-Behzadi | |
| 8,894,445 B2 * | 11/2014 | Jol | H01R 4/64 439/660 |
| 9,136,621 B1 | 9/2015 | Jaskela | |
| 2006/0023426 A1 | 2/2006 | Murakami | |
| 2008/0064265 A1 * | 3/2008 | Sterling | B29C 45/16 439/660 |
| 2010/0105238 A1 * | 4/2010 | Good | H01R 12/707 439/357 |
| 2013/0128476 A1 * | 5/2013 | Liou | H01R 13/5219 361/752 |
| 2014/0170903 A1 * | 6/2014 | Tuchrelo | H01R 13/665 439/620.21 |
| 2014/0285987 A1 | 9/2014 | Nagashima | |
| 2017/0162959 A1 | 6/2017 | Badia | |
| 2017/0307724 A1 * | 10/2017 | Park | G01S 13/87 |
| 2017/0324178 A1 * | 11/2017 | Liang | H01R 12/89 |
| 2018/0019425 A1 * | 1/2018 | Yasumoto | G09G 5/026 |
| 2018/0131109 A1 | 5/2018 | Wang | |

OTHER PUBLICATIONS

EP Search Report issued in EP Patent Application No. 19183743.4 dated Nov. 21, 2019, 11 pages.

* cited by examiner

*Primary Examiner* — Rockshana D Chowdhury
(74) *Attorney, Agent, or Firm* — Merchant & Gould P.C.

(57) ABSTRACT

The present disclosure relates to a control module having a connector and a housing. The housing defining a first opening that receives the connector, and a hermetically sealed interior housing at least one electronic component. The electronic component is electrically coupled to the connector. The control module further includes a retaining clip in physical contact with the housing and mechanically coupling the at least one electronic component to the connector.

29 Claims, 14 Drawing Sheets

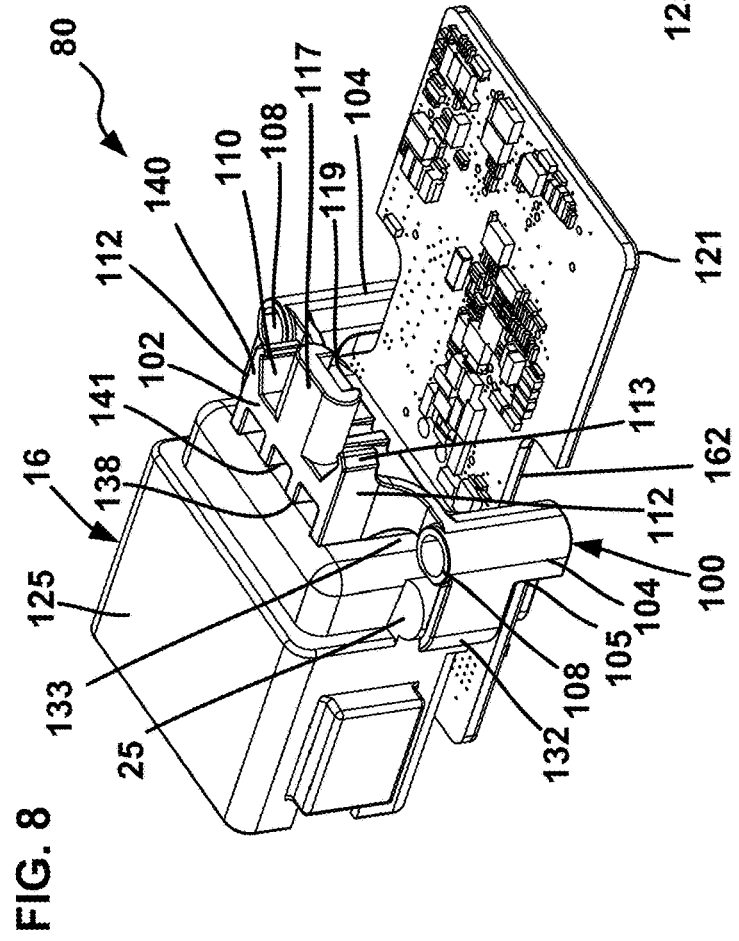
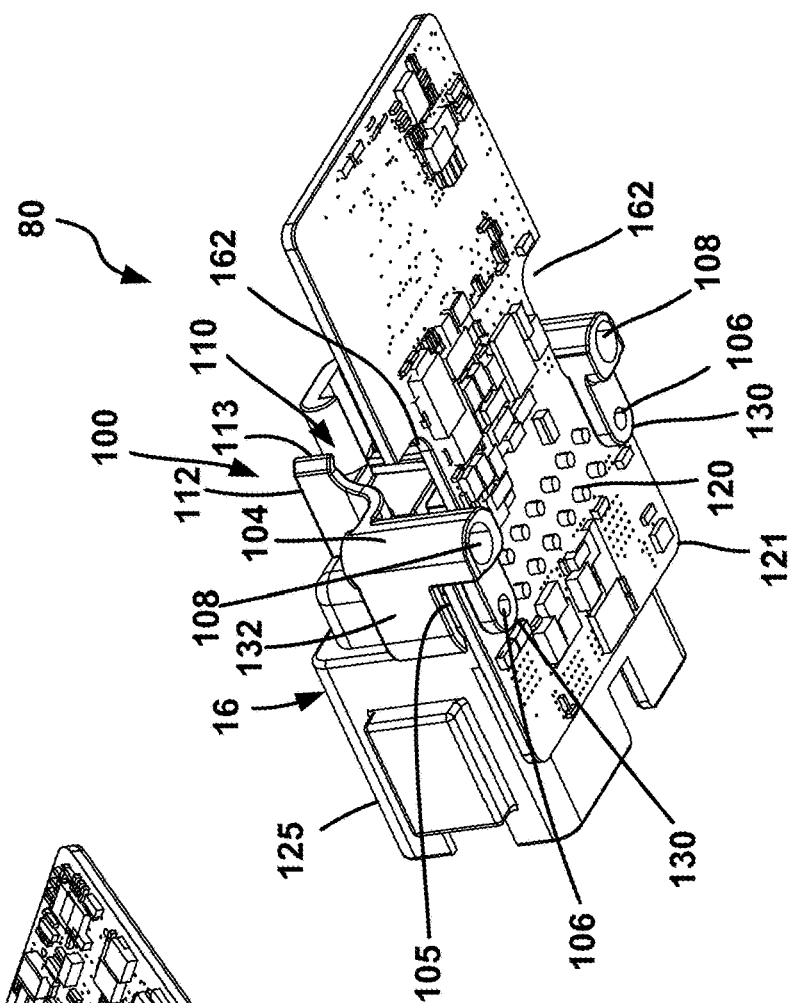

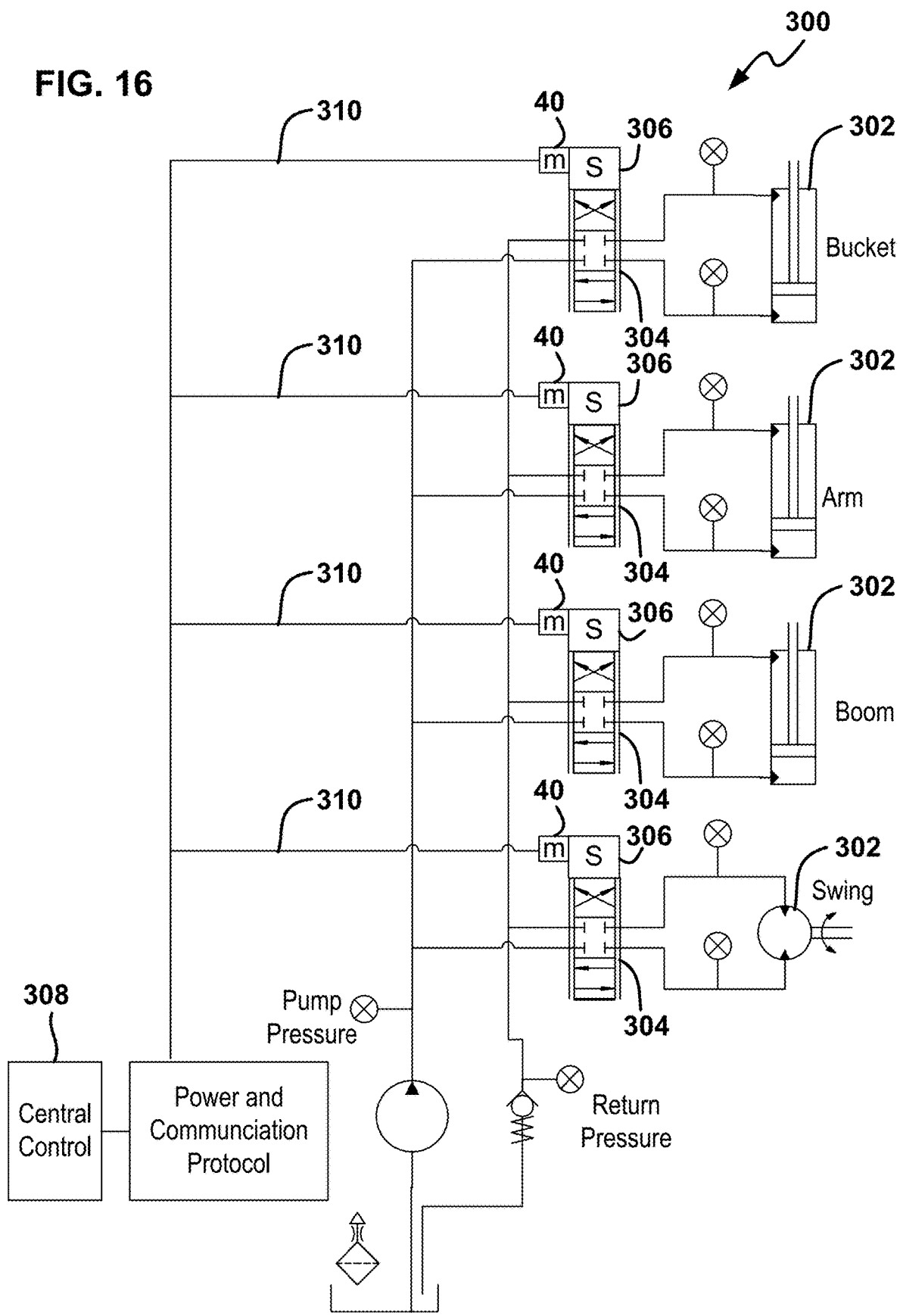

HYDRAULIC SYSTEM CONTROL MODULE HAVING IMPROVED HOUSING FEATURES AND METHOD OF MANUFACTURING THE SAME

CROSS-REFERENCE TO RELATED APPLICATION

This application claims the benefit of U.S. Patent Application Ser. No. 62/692,072, filed on Jun. 29, 2018, the disclosure of which is incorporated herein by reference in its entirety.

BACKGROUND

Hydraulic equipment and corresponding systems often rely on electromagnetic actuators such as solenoids to control the operating states of hydraulic valves used to control the operation of hydraulic actuators such as hydraulic cylinders or hydraulic motors. Control modules are used to control the electromagnetic actuators. Such control modules include delicate electronics susceptible to external stresses and contamination from the external environment.

SUMMARY

In general terms, the present disclosure is directed to an improved control module for hydraulic equipment and other applications, as well as a method of manufacturing such a control module. The control module includes a housing that houses a plurality of electronic components.

The principles of the present disclosure are not limited to a particular type of control module or to a particular use application for such a control module. Control modules of various types are used across many industries to control mechanical, electrical, electronic, hydraulic (e.g., a crane, a backhoe or other loader, an excavator, a tractor, a telehandler, etc.), pneumatic and other devices and systems. It should be appreciated that the present disclosure encompasses all such applications and types of control modules. In addition, the present disclosure encompasses any device that includes a housing that houses one or more electronic components where it is desirable to protect the electronics from stresses and contamination originating outside of the housing.

One benefit of the control module of the present disclosure is improved sealing by the housing of the electronics internal to the housing against water ingress and related failures.

Another benefit of the control module is reduced stress on the internal electronics from external forces.

Another benefit of the control module is a transparent or translucent window built in to the housing that allows visualization of indicator lights from at least one, at least two, or at least three different sides of the housing.

According to certain aspects of the present disclosure, a control module comprises a connector, and a housing defining a first opening that receives the connector, and a hermetically sealed interior housing at least one electronic component, the electronic component being electrically coupled to the connector, the control module further including a retaining clip in physical contact with the housing and mechanically coupling the at least one electronic component to the connector.

In some examples, the at least one electronic component is a printed circuit board (PCB). In some examples, pins of the connector are connected to the circuit board via conductors that are soldered to the circuit board. In some examples, the clip substantially defines a U-shape or squared U-shape. In some examples, the clip includes first and second pairs of through holes, the first pair of through holes being adapted to receive fasteners (e.g., screws) to secure the clip to the electronic component, and the second pair of through holes being adapted to receive fasteners (e.g., screws) to secure the control module to a support structure. In some examples, the clip includes a crossbar and two members extending substantially parallel to each other and substantially perpendicularly to the crossbar from opposite ends of the crossbar, the cross bar and two members substantially defining the U-shape or squared U-shape. In some examples, the two members define both the first and second pairs of through holes. In some examples, the members cooperate with shoulders of the connector to couple the connector to the at least one electronic component. In some examples, the crossbar defines a recess and one or more prongs adapted to secure a plug or a second connector. In some examples, the housing includes a transparent or translucent window through which light from one or more indicator light sources (e.g., light emitting diodes) of the at least one electronic component are visible externally to the housing. In some examples, the window extends continuously on at least two or at least three different sides of the housing. In some examples, two of the at least two or at least three different sides are at least substantially perpendicular or at least substantially parallel to each another. In some examples, the housing includes a first transparent inner layer and an opaque outer layer abutting the inner layer. In some examples, the housing is made from one or more flexible materials. In some examples, the inner housing layer is made from a transparent rigid material and the outer housing layer is made from an opaque flexible material.

According to further aspects of the present disclosure, a method of manufacturing a control module comprises: coupling a connector to a printed circuit board (PCB) with a clip; electrically connecting pins of the connector to the PCB; over-molding the PCB, the clip, and a portion of the connector with a first material to provide a housing that hermetically seals the PCB within the housing; and, optionally over-molding the first material with a second material, the second material forming an outer layer of the housing.

In some examples, the first material is transparent or translucent, the second material is opaque, and over-molding the second material is such that there is a void in the outer layer of the housing, the void corresponding to a window allowing visualization exterior to the housing of light from one or more light sources positioned on the PCB. In some examples, the void extends continuously on at least two or at least three sides of the housing. In some examples, the first material and the second material, or at least the second material, are flexible and adapted to provide a hermetic seal around the PCB. In some examples, the clip mechanically cooperates with shoulders of the connector, and the clip defines a plurality of openings through which fasteners (e.g., screws) are inserted to fasten the clip to the PCB and/or to fasten the control module to a support structure.

BRIEF DESCRIPTION OF THE DRAWINGS

FIG. 8 is a perspective view of a partially assembled control module of the present disclosure.

FIG. 9 is a further perspective view of the partially assembled control module of FIG. 8.

FIG. 16 depicts a distributed control system for a hydraulic system suitable for using control modules in accordance with the principles of the present disclosure.

DETAILED DESCRIPTION

Various embodiments will be described in detail with reference to the figures, where like reference numbers correspond to like features across the several views. Reference to various embodiments does not limit the scope of the claims attached hereto. Additionally, any examples set forth in this specification are not intended to be limiting and merely set forth some of the many possible embodiments for the appended claims.

Figure 1:
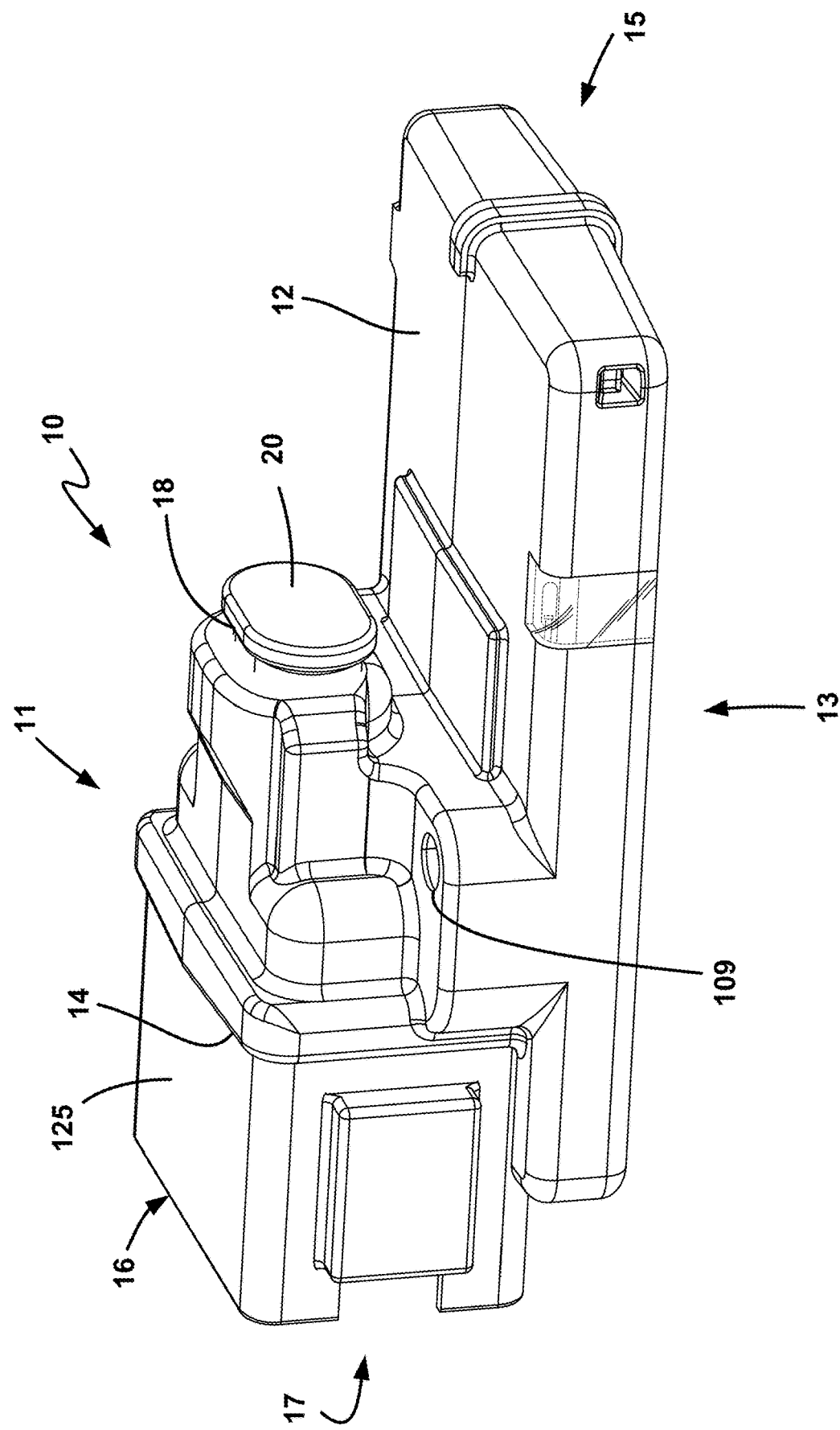
FIG. 1 is a perspective view of first embodiment of an assembled control module in accordance with the present disclosure.

Referring to FIG. 1, a controller 10 adapted to provide signals to control hydraulic fluid pressure and/or flow rate at one or more hydraulic drivers (e.g., cylinders) in hydraulic equipment includes a housing 12 defining a first opening 14 for receiving a connector 16 and a second opening 18 for receiving a plug 20. The connector 16 and the plug 20 are overmolded and fixed within their corresponding openings 14, 18. For purposes of illustration only, the controller 10 has a top 11, a bottom 13, a front 15, and a back 17. The connector 16 includes a plurality of conductors (e.g., pins 120, see FIGS. 10 and 11) adapted to electrically couple to a conductive harness received in the connector 16 from the back 17, the conductive harness acting as a data bus between the controller 10 and other electronics, such as memory, processors, input/output interfaces, etc. The pins 120 of the connector 16 are electrically connected to a PCB 121 (see FIGS. 8-10) housed inside the housing 12. In addition, electrical contacts disposed in or near the second opening 18 are also electrically connected with the PCB 121 housed inside the housing 12.

The connector 16 is depicted as a female connector including a socket 123 for receiving a plug of an electrical harness. The socket 123 is defined by a connector housing 125. The electrical pins 120 are positioned within the socket 123 and can be arranged in one or more rows (see FIG. 11). While the number of pins 120 can be varied, in certain examples, the connector 16 includes twelve of the pins 120 arranged in two rows of six pins each. In one example, the pins 120 each have a right angled configuration with upper and lower extensions 120a, 120b separated by a bend 127 (See FIG. 10). Each upper extension 120a is positioned within the socket 123 and extends parallel to the PCB 121 in a rearward direction from its corresponding bend 127. Each lower extension 120b is perpendicular to the PCB 121 and extends downwardly from its corresponding bend 127. The lower extensions 120b can be staked within vias defined by the PCB 121. The vias can electrically connect the pins 120 to conductive traces on the PCB 121.

The PCB 121 can include devices including memory and one or more electronic processors adapted to execute computer readable instructions stored in memory. The processors can be adapted to control operation of solenoids or other electronic actuators for controlling hydraulic valves or other hydraulic devices. The PCB 121 can also include sensing devices such as magnetometers, accelerometers and gyroscopes. In one example, the magnetometers, accelerometers and the gyroscopes can be three axis devices. The PCB 121 can also include power conversion circuitry. The extensions 120a of the pins 120 can provide sensor input locations, sensor output locations, power connection locations, solenoid connection locations, or other connection locations for interfacing with the PCB 121.

Figure 5:
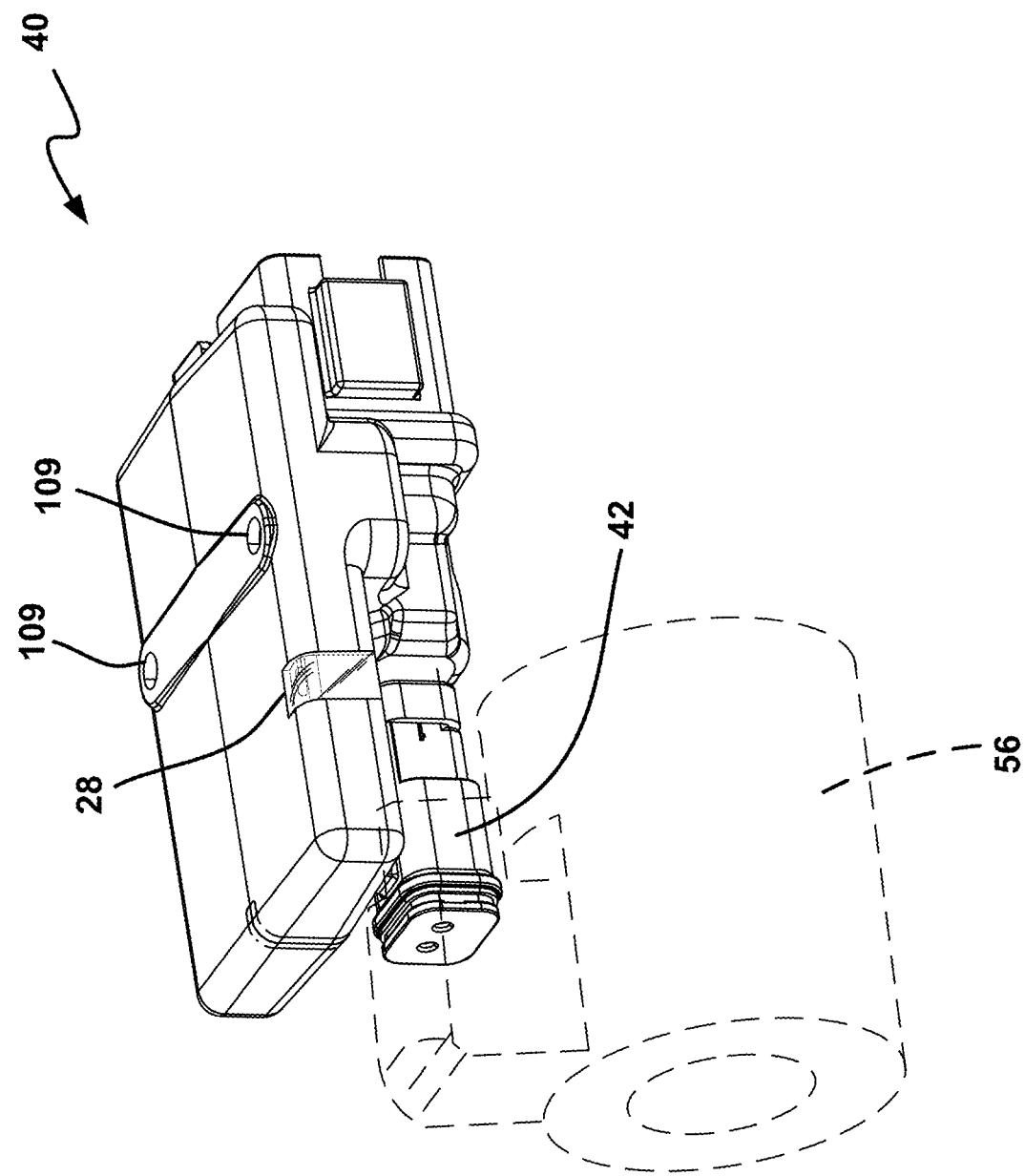
FIG. 5 is a side perspective view of the assembled control module of FIG. 2, the control module being connected to a solenoid.
Figure 7:
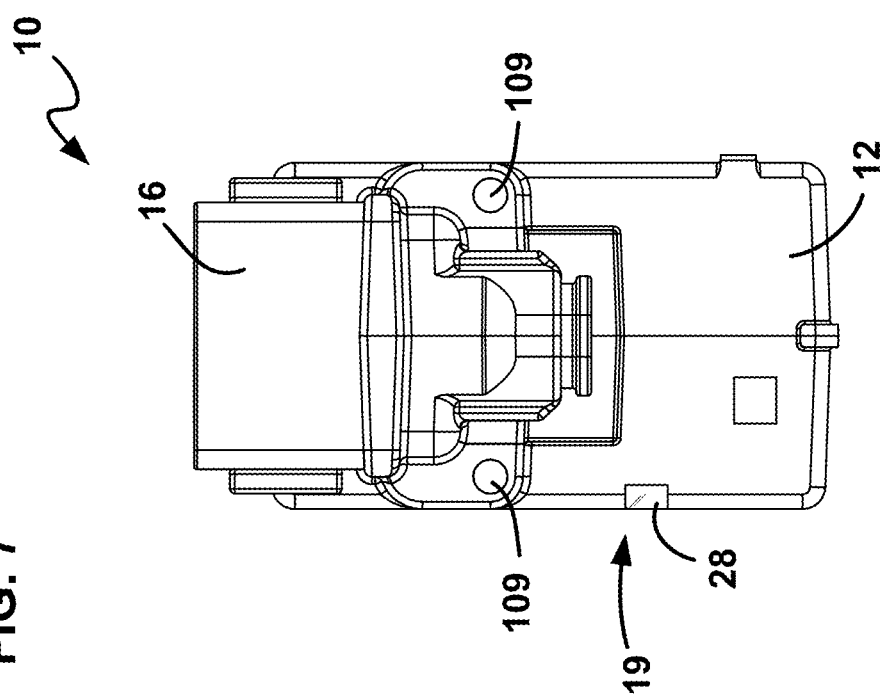
FIG. 7 is a top view of the assembled control module of FIG. 1.
Figure 6:
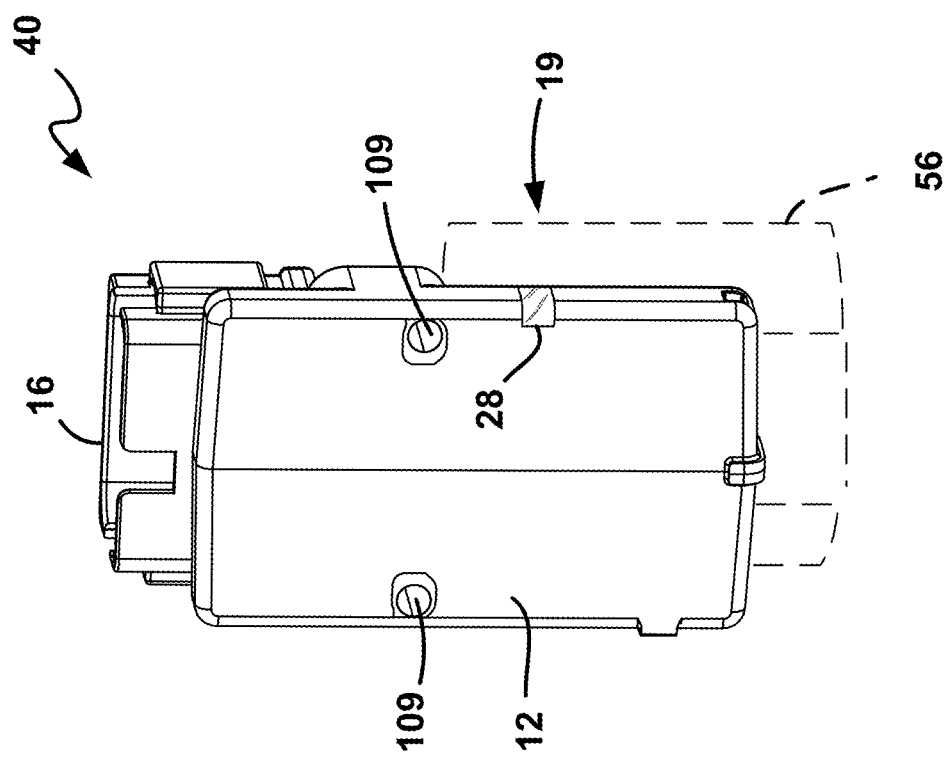
FIG. 6 is a bottom view of the assembled control module and solenoid of FIG. 5.

The housing 12 includes a transparent inner layer 22 (see cut-away at FIG. 4) and an opaque over-molded flexible outer layer 24 (see cut-away at FIG. 4) disposed on the inner layer 22. A void 26 in the outer layer 24 is formed during the molding process, providing a window 28. Light emitted by one or more light sources 30 positioned on the PCB 121 housed inside the housing 12 is visible through the window 28. Alternatively, a portion of the outer layer 24 is cut out after the outer layer 24 is formed, to provide the window 28. Referring to FIGS. 5-7, the window 28 in the controllers 40 and 10 is shown. As shown, light from light emitters on the PCB is visible in three different directions through the window 28 including from the top 11, from the bottom 13, and from the side 19. The window 28 thus has parallel portions on a top surface and bottom surface of the housing 12 and a perpendicular portion on the side adjoining the top and bottom portions. The control module can include light guides for guiding light (e.g., via total internal reflection or other means) from a light source (e.g., a light emitting diode) on the PCB 121 to the window 28.

Figure 2:
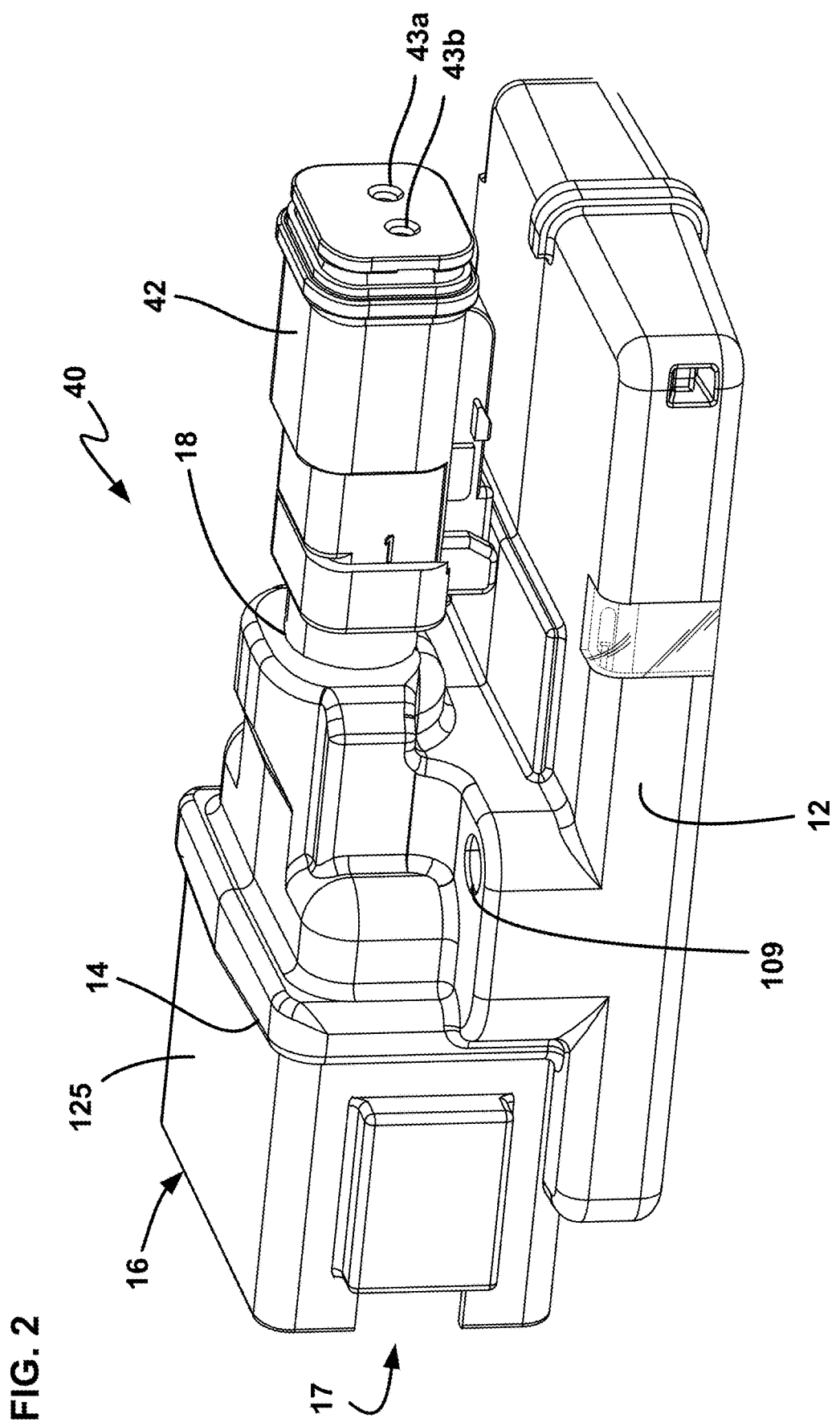
FIG. 2 is a perspective view of a second embodiment of an assembled control module in accordance with the present disclosure.

Referring the FIG. 2, the controller 40 of FIG. 2 is identical to the controller 10 of FIG. 1, except that instead of the plug 20, the controller 40 includes a solenoid connector 42. The solenoid connector 42 is a 2-contact (e.g., 2-pin) connector received (e.g., overmolded) in the opening 18 of the housing 12 and is electrically connected to the PCB 121 housed by the housing 12. The solenoid connector 42 includes contacts 43a, 43b which are preferably electrically connected to the circuit board 121 by electrical wires routed through the housing 12 from the contacts 43a, 43b to the circuit board 121. The solenoid connector 42 is adapted to connect to a solenoid, e.g., a solenoid that drives a spool of a spool valve or a poppet of a poppet valve to regulate flow to a hydraulic cylinder or other actuator. The controller 40 controls the solenoid by providing control signals via the connector 42. Referring to FIGS. 5 and 6, the 2-contact solenoid connector 42 of the controller 40 is shown connected to a solenoid 56.

Figure 3:
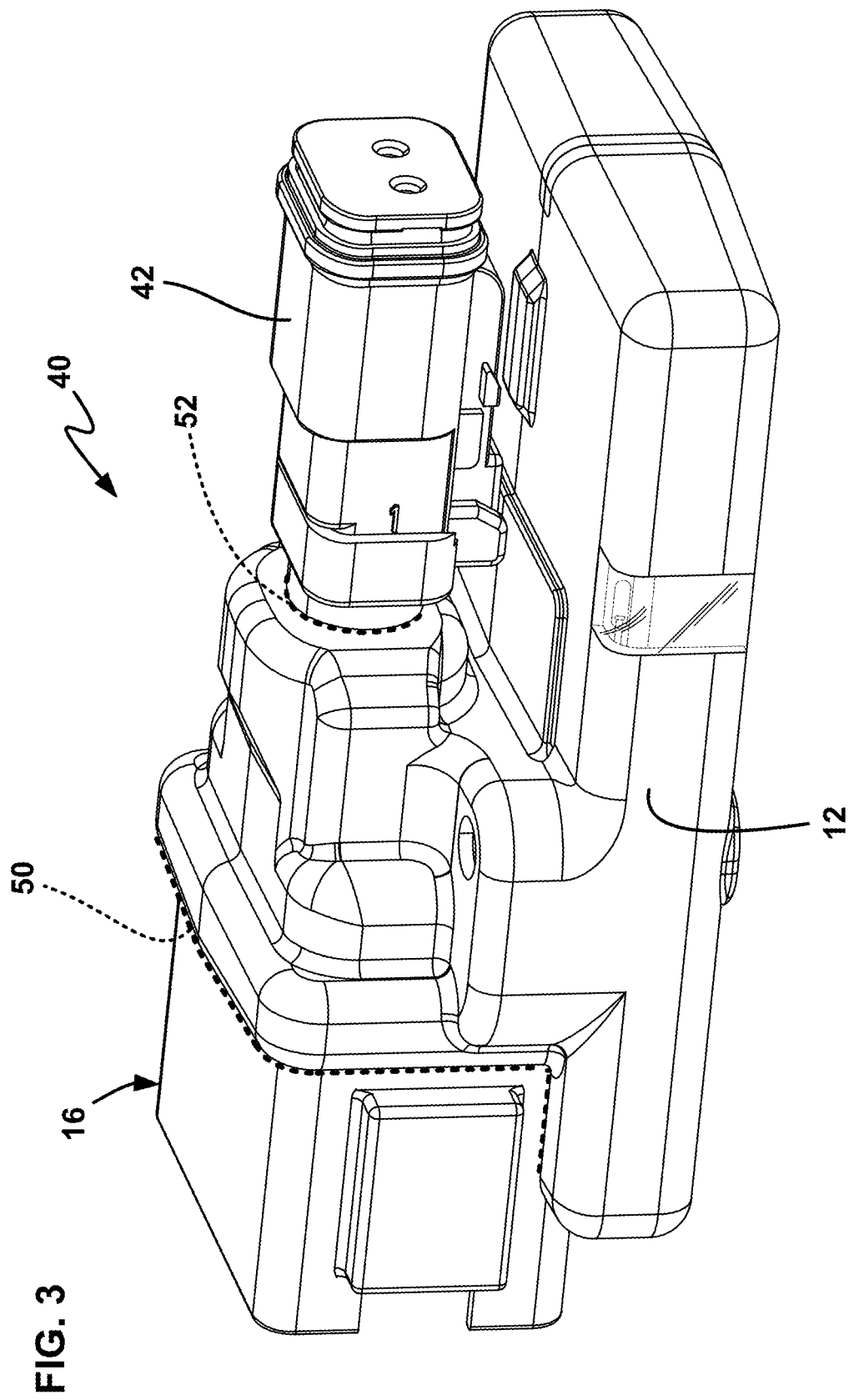
FIG. 3 is a perspective view of the assembled control module of FIG. 2, schematically illustrating mating surfaces for a molding procedure used to assemble the control module.
Figure 4:
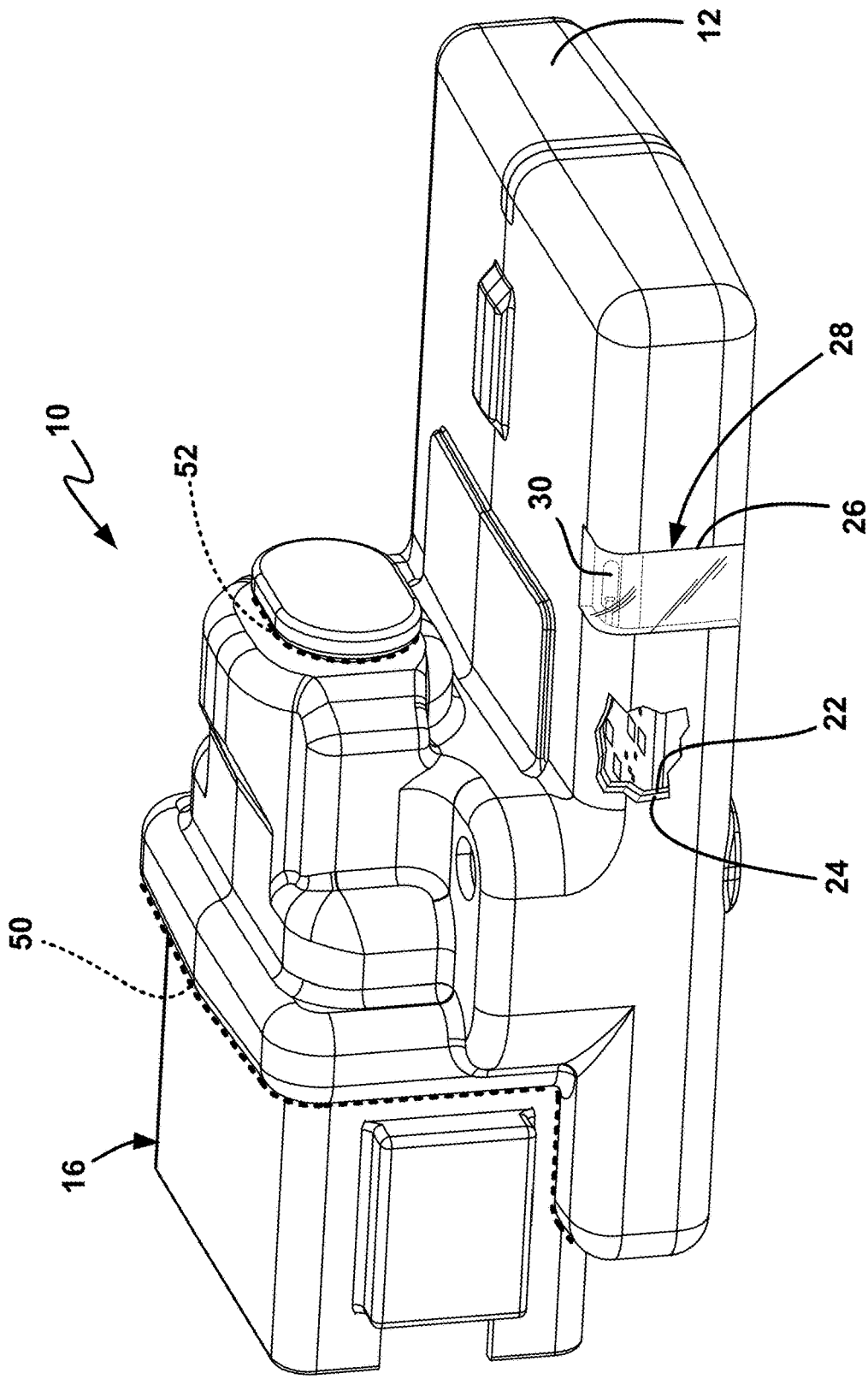
FIG. 4 is a perspective view of the assembled control module of FIG. 1, schematically illustrating mating surfaces for a molding procedure used to assemble the control module.

FIGS. 3-4 illustrate a cost saving feature of manufacturing the controllers 10 and 40. The superimposed lines 50 and 52 indicate mold mating surfaces, i.e., surfaces where molds mate during the molding of the housing 12. The mating surfaces 50 and 52 are the same whether the finished controller includes the plug 20 or the connector 42. Thus, the same molds can be used to manufacture both controller embodiments 10 and 40, which can save manufacturing cost.

Referring to FIGS. 8-9, a partially assembled controller is shown. The partially assembled controller can be assembled into either the controller 10 or the controller 40 described above. In certain implementations, the partial assembly 80 includes the harness connector 16, the PCB 121 having circuitry and LED indicator lights, a retainer clip 100, and the plug 20 or the connector 42 (not shown at FIGS. 8 and 9).

The retainer clip 100 substantially defines a squared U-shape. In particular, the retainer clip 100 includes a crossbar 102 and two side members 104 extending substantially parallel to each other and substantially perpendicularly to the crossbar 102 from opposite ends of the crossbar, the crossbar 102 and two side members 104 substantially defining the squared U-shape. The retainer clip 100 has a front side 140 adapted to face toward the front 15 of the controller 10 and a back side 141 adapted to face toward the back 17 of the controller 10. The clip 100 is preferably a unitary molded plastic piece.

The retainer clip 100 includes first and second pairs of through holes, 106, 108, the first pair of through holes 106 being adapted to receive fasteners (e.g., screws) to secure the clip 100 to the PCB 121, and the second pair of through holes 108 being adapted to receive fasteners (e.g., screws) to secure the control module 10, 40 to a support structure, such as the surface 90 (FIG. 10) of a portion of a piece of machinery into which the controller is integrated. The support surface 90 can also be a valve block or manifold including valves controlled by the controller 10, 40. The through holes 108 extend lengthwise in a vertical orientation through the side members 104. When the housing 12 is overmolded over the retainer clip 100, one or more inserts can be used to ensure the housing defines fastener openings 109 (FIGS. 6 and 7) that co-axially align with the through holes 108 so that fasteners can be inserted vertically through the overmolded walls of the housing 12 as well as through the through holes 108 to secure the controller 10, 40 to a support surface 90.

The retainer clip 100 includes board engagement tabs 130 and connector latching fingers 132 (e.g., retaining fingers) that project rearwardly from the back side 141 of the clip 100. The board engagement tabs 130 and the connector latching fingers 132 have base ends that are unitary with the side members 104. The board engagement tabs 130 are located adjacent lower ends of the side members 104 and the connector latching fingers 132 are positioned at mid locations along the lengths of the side members 104 above the board engagement tabs 130. The board engagement tabs 130 have major sides that are aligned along a horizontal plane and the connector latching fingers 132 have major sides aligned along vertical planes. Board receiving notches 105 are defined vertically between the board engagement tabs 130 and the connector latching fingers 132. The through holes 106 are defined through the major sides of the board engagement tabs 130 and preferably extend through the board engagement tabs 130 in a vertical orientation. A connector receiving pocket 133 is defined between the connector latching fingers 132 at the back side 141 of the clip 100. The pocket 133 is adapted to receive the connector housing 125 of the connector 16 therein. The clip 100 also includes a plurality of vertical rails 138 at the back side 141 within the pocket 133 which function as stand-offs against which the connector housing 125 abuts when the connector 16 is mounted in the pocket 133 and retained in the pocket 133 by the latching fingers 132. Laterally inwardly projecting latching catches 135 are provided adjacent rear ends of the latching fingers 132 for assisting in retaining the connector 16 in the pocket 133.

When the connector housing 125 is inserted rearwardly into the pocket 133, the latching fingers 132 engage opposite lateral shoulders 25 of the connector housing 125 causing the latching fingers 132 to flex laterally outwardly to accommodate the connector housing. The latching fingers 132 resiliently snap back laterally inwardly to retain the connector housing 125 in the pocket 133 by a snap-fit connection once the shoulders 25 move past the catches 135 and the connector housing 125 abuts against the rails 138. With the connector housing 125 is fully inserted into the pocket 133, the housing 125 is secured between the catches 135 and the rails 138.

The clip 100 also includes another connector pocket 110 (e.g., a recess) at the front side 140 of the clip 100 for mounting the solenoid connector 42 or the plug 20 to the clip 100. The connector pocket 110 is defined by latching fingers 112 (e.g., prongs) that extend forwardly from the cross bar 102. The latching fingers 112 have base ends integrally formed with the cross-bar and include catches 113 adjacent free ends of the latching fingers 112. The catches 113 project laterally inwardly from the free ends and are adapted for engaging flanges 115 (see FIG. 10) on the solenoid connector 42 or the plug 20 when such structures are mounted in the connector pocket 110 to retain such structures in the pocket 110 by a snap-fit connection. The clip 100 also includes an insert portion 117 that projects forwardly from the cross bar 102 into the pocket 110 at a location between the latching fingers 112. The insert portion 117 is adapted to fit within an opening of the solenoid connector 42 or plug 20 and preferable has a shape that complements the opening. The insert portion 117 defines central wire passage 119 for routing wires or other conductors from the connector 42 through the insert portion 117 and into the interior of the housing 12. The front side of the clip 100 can include vertical channels 160 for routing the electrical wires from the insert portion 117 through the housing 12 to the PCB 121. The wires preferably are electrically connected to conductive traces on the PCB 121.

As shown at FIGS. 8 and 9, the PCB 121 includes side notches 162 for receiving lower ends of the side members 104 of the clip 100. During the assembly process, the lower ends of the conductors 120 of the connector 16 can be coupled to the PCB 121 such that the connector is at the top side of the PCB 121. The retaining clip 100 can then be positioned with the lower ends of the side members 104 in the side notches 162. As so positioned, the retaining clip 100 can be slid forwardly relative to the PCB 121 and the connector 16 such that the connector 16 snaps into the pocket 133 and the PCB 121 fits into the notch 105 with the board engagement tabs 130 positioned beneath the PCB 121. Fasteners such as screws can then be installed through the openings 106 in the board engagement tabs 130 to secure the clip 100 and the connector 16 to the PCB 121. For example, the fasteners such as screws can be driven upwardly through the openings 106 and through the PCB 121 into the shoulders 25 of the connector 16 to lock the clip 100 and the connector 16 in place relative to the PCB 121.

The solenoid connector 42 or the plug 20 can then be installed at the pocket 110 to secure the connector 42 or plug 20 to the clip 100, and any wire routing and electrical connections with the PCB 121 corresponding to the plug 20 or the connector 42 are completed. After the mechanical connections are made to the 2 and 12 pin connectors 42, 16, soldering is performed. Soldering only after forming the connections inhibits stress from being applied to the solder joints. The assembly can then be placed in a mold, and the inner layer 22 can be overmolded over the assembly to form the housing 12 such that PCB 121, the clip 100, and portions of the connector 16 and the connector 42 or plug 20 are encased within the inner layer 22. The inner layer 22 can provide sealing and mechanical protection with respect to the inner parts. In certain examples, the inner layer can adhere to the circuit board and portions of the connector 16, the connector 42 or the plug 20. In certain examples, portions of the connector 16, the connector 42 or the plug can be overmolded and embedded within the inner layer 22 to provide mechanical couplings between the inner layer 22 and the parts 16, 42, 20 and to provide enhanced mechanical securement of the parts 16, 42, 20 with respect to the PCB 121.

In a preferred example, the outer layer 24 is overmolded over the inner layer 22 in a subsequent overmolding process. In certain examples, the inner and outer layers 22, 24 can have different properties such as hardness, color, or light transmissivity. In one example, the inner layer 22 is transparent and the outer layer 22 is opaque. In other embodiments, the overmolding may optionally include only one overmolded layer. Thus, the outer layer 24 can be eliminated.

FIGS. 8 and 9 show the clip 100 and the connector 16 assembled on the PCB 121. As assembled, the board engagement tabs 130 are aligned (in the top to bottom direction) with the shoulders 25 of the connector 16 to couple the connector 16 to the PCB 121 by inserting fasteners into through holes in the shoulders 25, the aligned through holes 106 in the clip 100, and through the PCB 121. In addition, the retaining clip 100 can be made from a rigid but resilient material, and appropriately dimensioned relative to the shoulder 25 to allow the retaining clip 100 to be snapped about the shoulders 25 and thereby provide frictional coupling between the retaining clip 100 and the connector 16 even before fasteners are inserted in the through-holes 106. In at least some examples, the retaining clip 100 is made from a substantially rigid material that is more rigid than the materials used for the inner or outer layers 22 and 24 of the housing 12. Thus, the retaining clip 100 is a frame that provides structural reinforcement to the controller 40.

Once the housing 12 is formed, the through holes 108 (see FIGS. 5-7) remain exposed on the top 11 and bottom 13 of the controller 10, 40, allowing fasteners to be inserted in the through holes to secure the controller 10, 40 to a support structure (e.g., the surface 90 in FIG. 10), using the retaining clip 100, which is then entirely or almost entirely housed by the housing 12.

Figure 10:
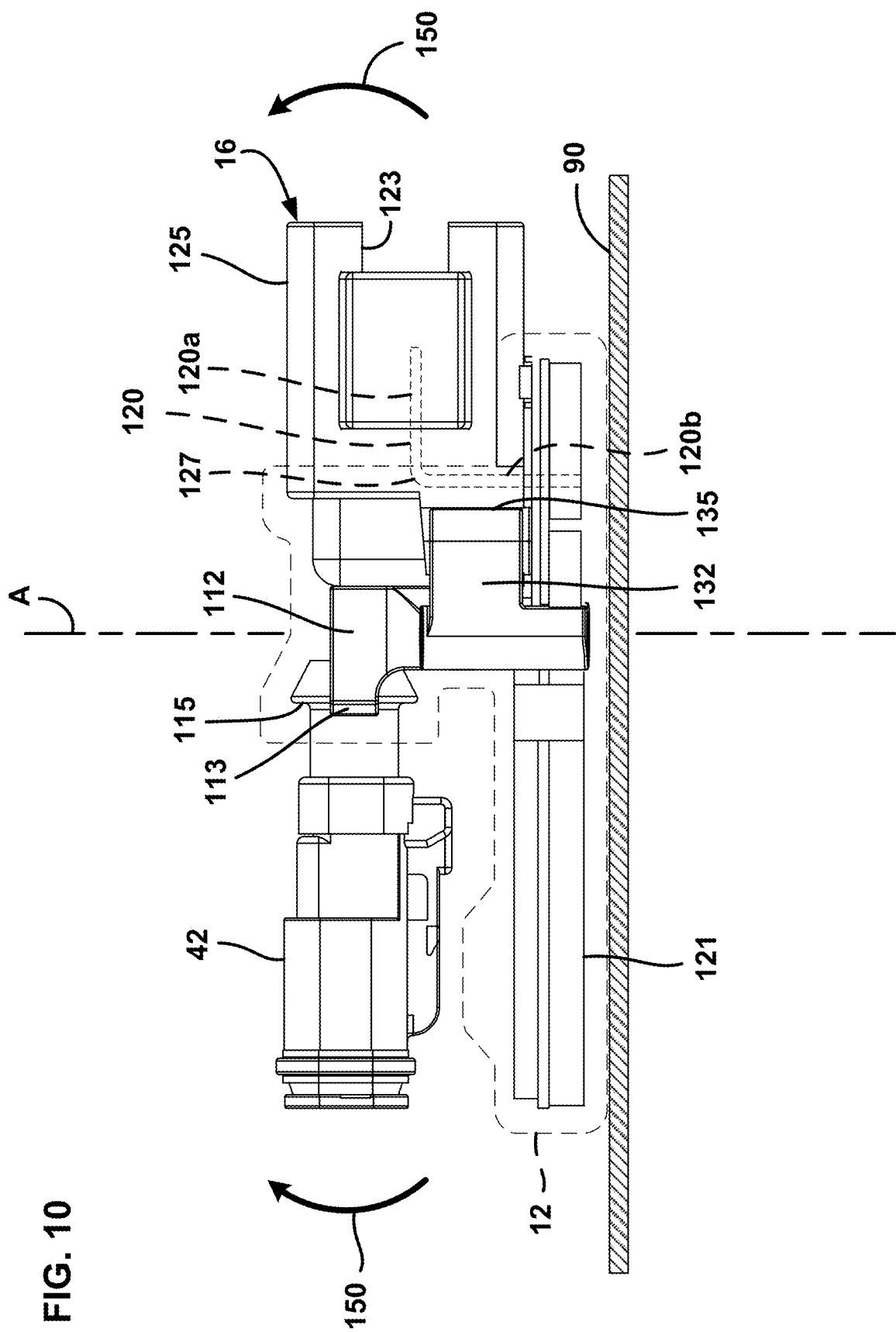
FIG. 10 is a side view of the control module of FIG. 2 including transparencies to aid in description.
Figure 11:
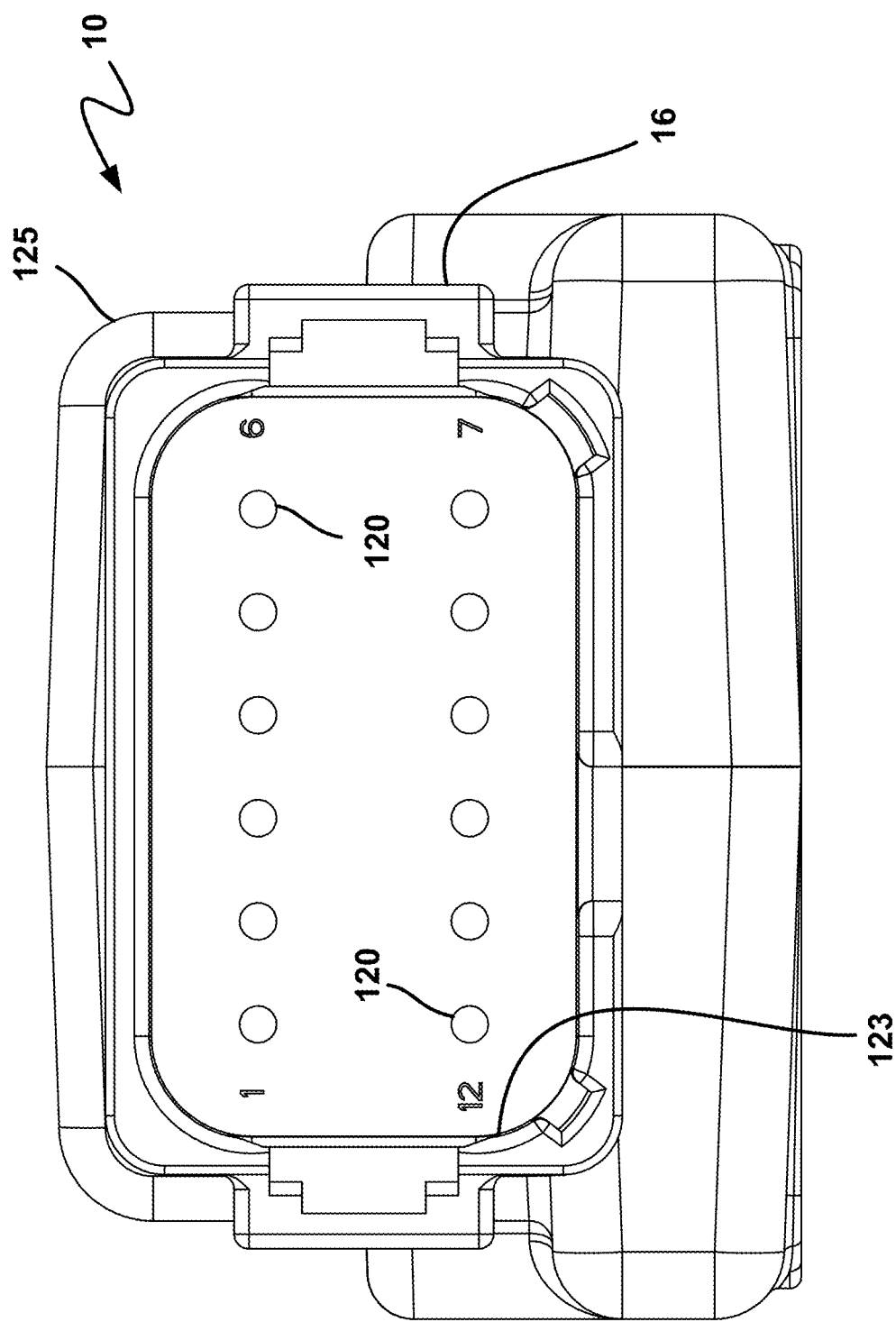
FIG. 11 is a back view of the control module of FIG. 1.
Figure 12:
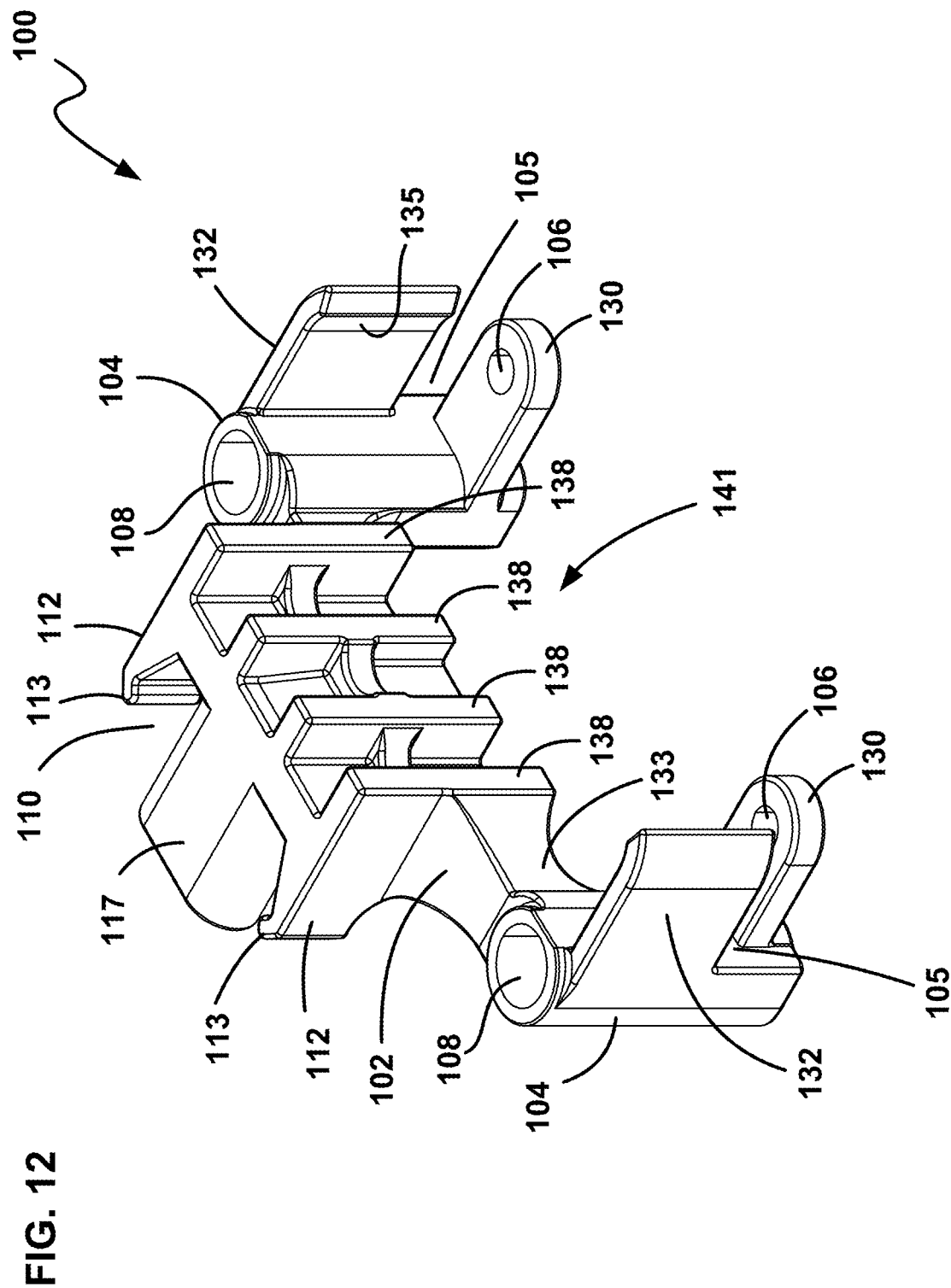
FIG. 12 is a perspective of a retaining clip used in control modules in accordance with the principles of the present disclosure for structurally securing connectors of the modules to circuit boards of the modules.
Figure 13:
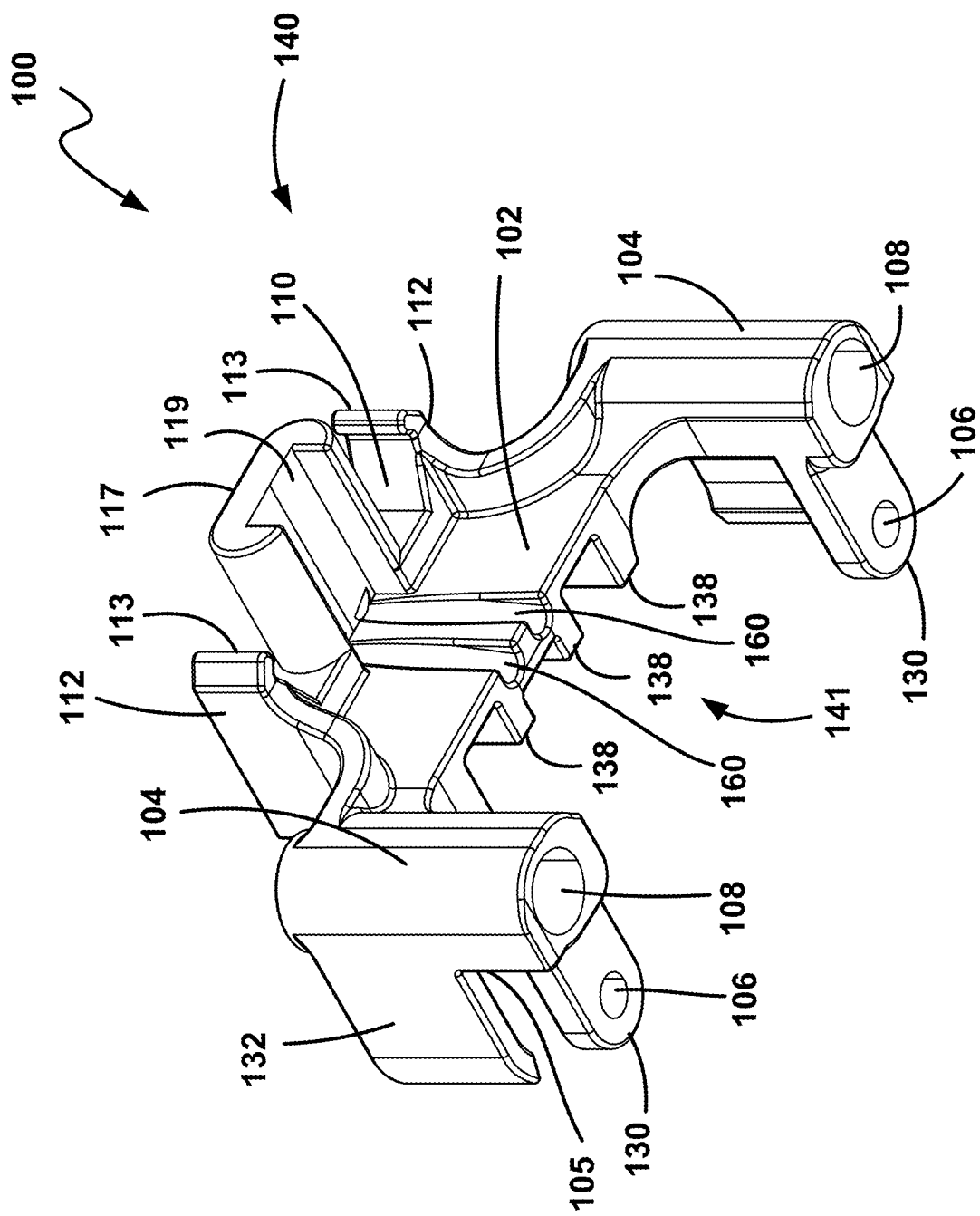
FIG. 13 is another perspective view of the retaining clip of FIG. 12.

Referring to FIG. 10, the controller 40 is shown fastened to a flat surface 90 of a support structure using fasteners inserted through the through holes 108 that are open at the top and bottom of the housing 12. Because the PCB 121 is coupled directly only to the retaining clip 100 and the connector 16, and this coupling is essentially along or approximately along a single reference plane or axis A, pivotal movement of the connector 42 in the direction of either of the arrows 150 imparts little to no stress on the PCB 121. Reducing stress on the PCB 121 in this way and similar ways using the controller assemblies of the present disclosure provides a more durable controller that is less susceptible to damage. For example, when the controller 40 is attached to the surface 90 by fasteners extending through the openings 108, loading/torque applied to the connector 16 or the connector 42 is transferred through the clip 100 to the surface 90 thereby bypassing the PCB 121 and preventing or reducing flexing of the PCB 121. When the controller 40 is attached to a solenoid, side loading applied to the connector 16 can be transferred to the solenoid through the clip 100, thereby bypassing the PCB 121.

Figure 14:
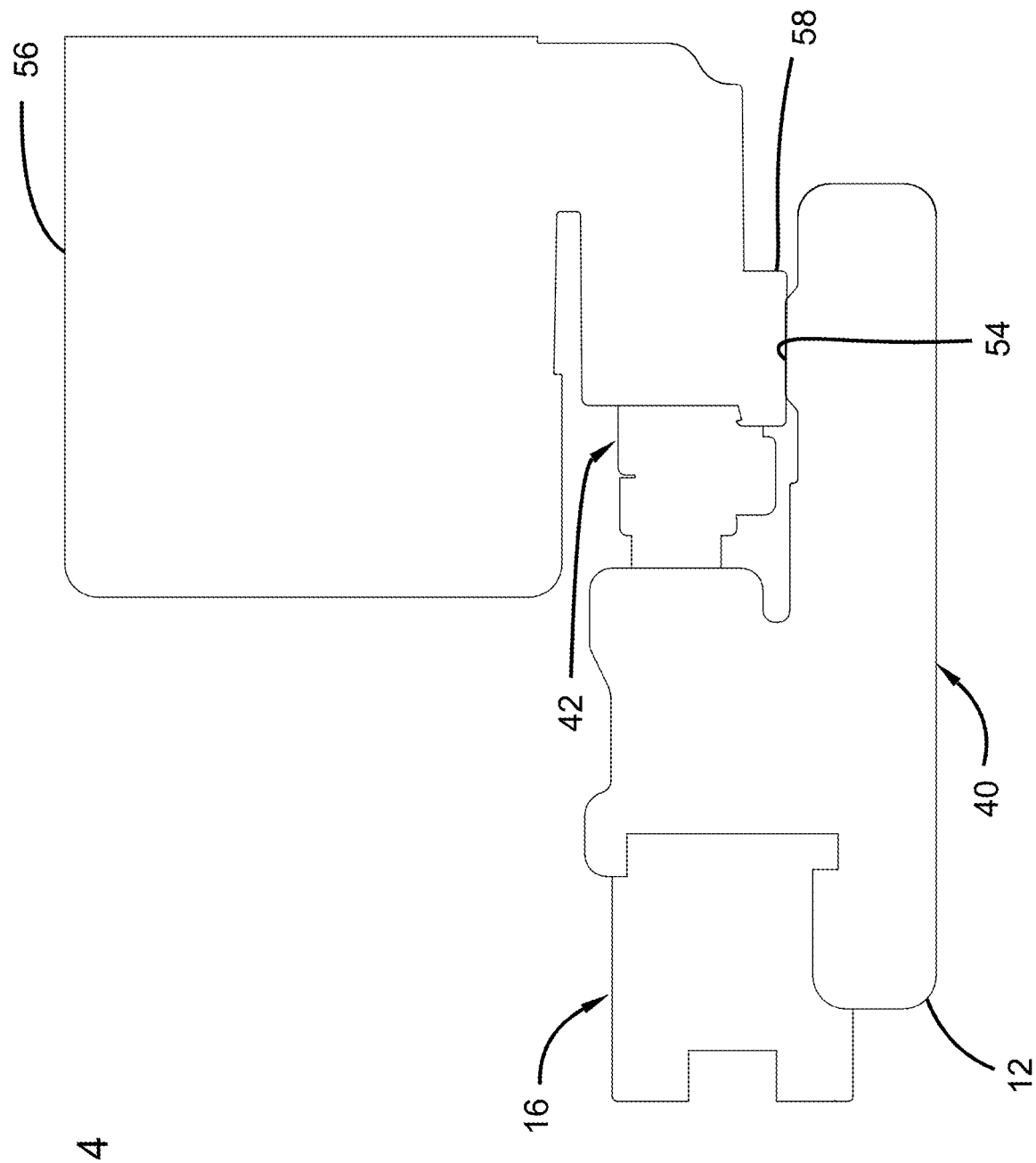
FIG. 14 is a side elevational view of the control module of FIG. 2 connected with a solenoid.

Referring to FIG. 14, the solenoid connector 42 mates with a connector 58 of the solenoid 56. The mating connector 58 has a body that extends at least partially around a periphery of the solenoid connector 42. In certain implementations, the housing 12 includes a support member 54 that contacts the body of the mating connector 58 when the mating connector 58 is fitted with the solenoid connector 42. The body of the mating connector 58 seats on the support member 54 to inhibit strain from being applied to the mating connector 58 at the point of connection between the solenoid connector 42 and the mating connector 58.

Figure 15:
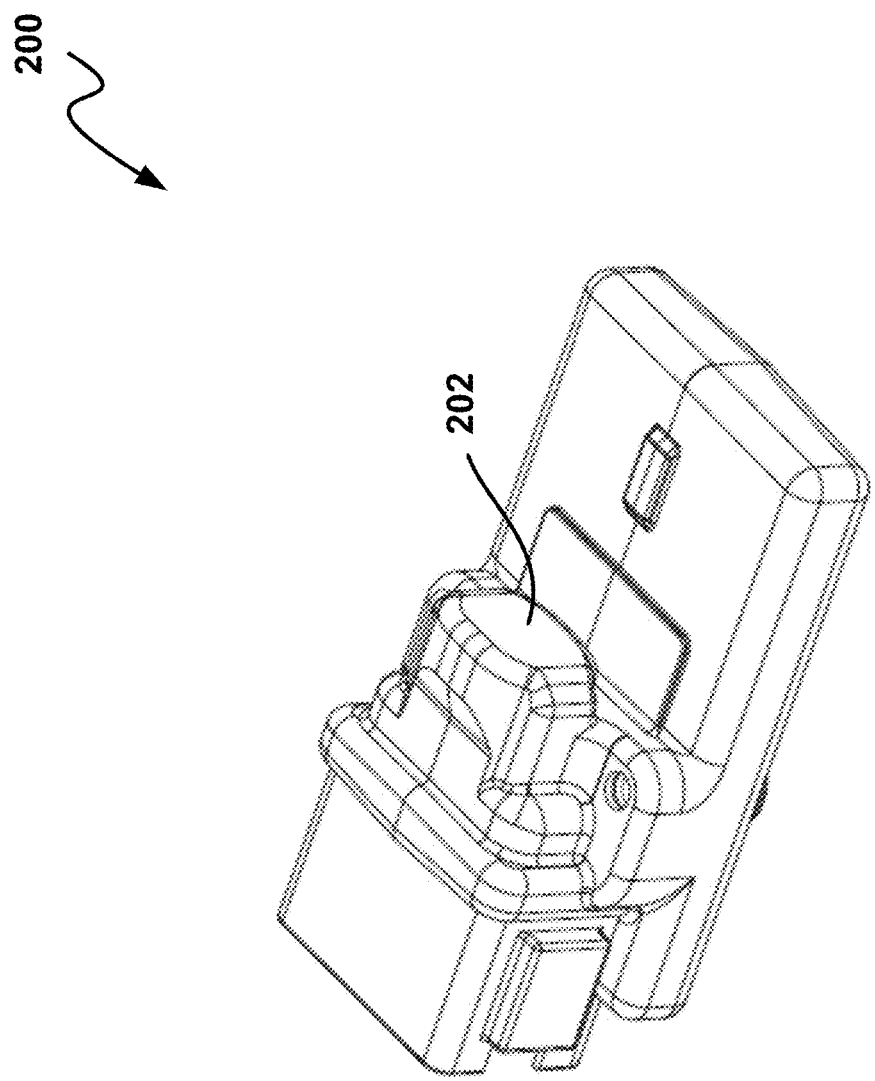
FIG. 15 depicts another control module in accordance with the principles of the present disclosure.

FIG. 15 depicts another controller 200 (e.g., a control module) in accordance with the principles of the present disclosure. The controller 200 has the same construction as the controllers 40, 10 except the solenoid connector 42 and the plug 20 have been eliminated and this region is closed with overmolded material of the housing to form a closed, blank location 202. In this example, all electrical connections with solenoids, sensors, power, bus connections and other connections can be made through the connector 16 via an electrical wire harness.

FIG. 16 shows a hydraulic system 300 incorporating modular controllers 40 in accordance with the principles of the present disclosure. The hydraulic system 300 includes hydraulic actuators 302 (e.g., hydraulic cylinders, hydraulic motors, etc.) distributed throughout the system. The hydraulic actuators 302 are controlled by valves 304 which are controlled by solenoids 306. The controllers 40 are each assigned to a given one of the solenoids 306 and thus are distributed throughout the system to provide a distributed control system. The controllers 40 are shown mounted to each solenoid 306, but could also be mounted to the valve blocks or elsewhere in relative close proximity to their assigned solenoid. A communication protocol (e.g., Ethernet, CAN bus) can be used as part of a network (e.g., with wired and optionally wireless communication capabilities) to coordinate operation of the controllers 40 through a central control 308. Wiring can be used to provide power to the controllers 40 and solenoids and to allow for communication between the various electronic components of the system. The wiring can include wiring harnesses 310 that branch from a central cable or cables. In certain examples, the hydraulic system 300 can be integrated as part of an off-road vehicle such as a piece of construction or agricultural equipment for controlling operation of active components of the vehicle. Example pieces of equipment can include cranes, backhoes loaders, excavators, tractors, telehandlers, concrete pump trucks, etc.

The various embodiments described above are provided by way of illustration only and should not be construed to limit the claims attached hereto. Those skilled in the art will readily recognize various modifications and changes that may be made without following the example embodiments and applications illustrated and described herein, and without departing from the true spirit and scope of the following claims.

What is claimed is:

1. A control module comprising:
a connector;
a printed circuit board (PCB) electrically coupled to the connector, the PCB having a length that extends between opposite first and second edges of the PCB, the PCB also having a width perpendicular with respect to the length that extends between opposite third and fourth edges of the PCB, the PCB further including first and second opposite sides, the PCB also defining notches at the third and fourth edges that extend through the PCB from the first side to the second side;
two side members extending through the notches of the PCB, each side member including a through hole adapted to receive fasteners to secure the control module to a support structure;
tabs that project from the side members, the tabs being fastened to the second side of the PCB; and
a housing overmolded over the PCB, the side members and at least a portion of the connector;
wherein the connector and the PCB are coupled together substantially along a single reference plane.

2. The control module of claim 1, further comprising a magnetometer provided on the PCB.

3. The control module of claim 1, further comprising a gyroscope provided on the PCB.

4. The control module of claim 1, further comprising an accelerometer provided on the PCB.

5. The control module of claim 1, wherein the housing includes a transparent window through which light from one or more indicator light sources positioned on the PCB are visible externally to the housing.

6. The control module of claim 5, wherein the window extends continuously on at least two or at least three different sides of the housing.

7. The control module of claim 6, wherein two of the at least two or at least three different sides are at least substantially perpendicular or at least substantially parallel to each another.

8. The control module of claim 1, wherein the housing includes a first transparent inner layer and a second opaque outer layer abutting the inner layer.

9. The control module of claim 1, wherein the housing is made from one or more flexible and waterproof materials.

10. A method of manufacturing the control module of claim 1, the method comprising:
electrically connecting pins of the connector to the PCB;
providing the side members on either side of the PCB such that the side members extend through the notches of the PCB;
over-molding the PCB, the side members and a portion of the connector with a first material; and
optionally over-molding the first material with a second material, the second material forming an outer layer of the housing.

11. The method of claim 10, wherein the first material is transparent, the second material is opaque, and the over-molding the second material is not optional and is such that there is a void in the outer layer of the housing, the void corresponding to a window allowing visualization exterior to the housing of light from one or more light sources positioned on the PCB, and wherein the void optionally extends continuously on at least two or at least three sides of the housing.

12. A control module comprising:
a printed circuit board having a first side and an opposite second side;
a connector coupled to the printed circuit board, the connector including a connector housing located at the first side of the printed circuit board, the connector including electrical pins positioned within the connector housing, the electrical pins being staked within vias of the printed circuit board;
a clip secured to the printed circuit board and the connector housing;
a module housing overmolded over the printed circuit board, the clip and a portion of the connector housing;
the clip including a crossbar at the first side of the printed circuit board and two members extending substantially parallel to each other and substantially perpendicularly to the crossbar from opposite ends of the crossbar, the crossbar and two members substantially defining a squared U-shape which straddles a width of the printed circuit board;
the clip including first and second pairs of through holes, the first pair of through holes being adapted to receive fasteners to secure the clip to the printed circuit board, and the second pair of through holes being adapted to receive fasteners to secure the control module to a support structure,
the two members defining the second pair of through holes through lengths of the two members, the two members extending through notches of the circuit board from the first side of the circuit board to the second side of the circuit board, the first pair of through holes being defined by circuit board engagement tabs that project from the members at the second side of the circuit board, and the members including latching fingers that engage shoulders of the connector housing to mechanically couple the clip to the connector housing.

13. The control module of claim 12, wherein the connector and the printed circuit board are coupled to the retaining clip substantially along a single reference plane.

14. The control module of claim 12, wherein the module housing includes a transparent window through which light from one or more indicator light sources positioned on the printed circuit board are visible externally to the module housing.

15. The control module of claim 14, wherein the window extends continuously on at least two or at least three different sides of the module housing.

16. The control module of claim 15, wherein two of the at least two or at least three different sides are at least substantially perpendicular or at least substantially parallel to each another.

17. The control module of claim 12, wherein the module housing includes a first transparent inner layer and a second opaque outer layer abutting the inner layer.

18. The control module of claim 12, wherein the module housing is made from one or more flexible and waterproof materials.

19. A control module comprising:
a printed circuit board having a length that extends between opposite first and second edges of the printed circuit board, the printed circuit board also having a width perpendicular with respect to the length that extends between opposite third and fourth edges of the printed circuit board, the printed circuit board further including first and second opposite sides, the printed circuit board also defining notches at the third and fourth edges that extend though the printed circuit board from the first side to the second side;

a main body that extends across the width of the printed circuit board at the first side of the printed circuit board, the main body including side members that project from opposite sides of the main body and extend through the notches of the printed circuit board, the side members defining through holes adapted to receive fasteners to secure the control module to a support structure, the through holes extending though lengths of the side members and being transversely oriented with respect to the printed circuit board, the main body having a first side that faces toward the first edge of the printed circuit board and a second side that faces toward the second edge of the printed circuit board;

tabs that project from the side members, the tabs being fastened to the second side of the printed circuit board;

a first connector connected to the printed circuit board, the first connector being secured to the main body;

wherein the first connector and the printed circuit board are coupled together substantially along a single reference plane; and a module housing overmolded over the printed circuit board, the main body and at least a portion of the first connector.

20. The control module of claim 19, wherein the main body includes first latching fingers that engage the first connector.

21. The control module of claim 20, wherein the connector includes a connector housing in which electrical pins are housed, the electrical pins being staked to the printed circuit board.

22. The control module of claim 19, further comprising a plug positioned at the second side of the main body, the module housing being overmolded over at least a portion of the plug.

23. The control module of claim 22, further comprising a second connector positioned at the second side of the main body, the module housing being overmolded over at least a portion of the plug.

24. The control module of claim 21, further comprising a second connector positioned at the second side of the main body, the module housing being overmolded over at least a portion of the second connector, the main body including second latch arms that engage the second connector, the main body further including channels for receiving electrical conductors for electrically connecting the second connector to the printed circuit board.

25. The control module of claim 19, further comprising a magnetometer provided on the printed circuit board.

26. The control module of claim 19, further comprising a gyroscope provided on the printed circuit board.

27. The control module of claim 19, further comprising an accelerometer provided on the printed circuit board.

28. The control module of claim 19, further comprising a light source provided on the printed circuit board, wherein the module housing includes a transparent inner layer covered by an opaque layer, wherein the opaque layer includes a window for allowing light from the light source to be visible from outside the module housing.

29. The control module of claim 28, wherein the window coincides with the first side, the second side and one of the first, second, third or fourth edges of the printed circuit board.

* * * * *